US007425371B2

(12) United States Patent
Sharma et al.

(10) Patent No.: US 7,425,371 B2
(45) Date of Patent: *Sep. 16, 2008

(54) THERMOSETTING RESIN COMPOSITION FOR HIGH PERFORMANCE LAMINATES

(75) Inventors: Jyoti Sharma, Onalaska, WI (US); Martin Choate, Onalaska, WI (US); Steve Peters, Rockland, WI (US); Kevin Rafferty, Winona, MN (US)

(73) Assignee: Isola USA Corp., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/132,846

(22) Filed: May 19, 2005

(65) Prior Publication Data

US 2005/0215707 A1    Sep. 29, 2005

Related U.S. Application Data

(63) Continuation of application No. 10/309,720, filed on Dec. 4, 2002, now Pat. No. 7,090,924.

(60) Provisional application No. 60/337,362, filed on Dec. 5, 2001.

(51) Int. Cl.
| | |
|---|---|
| B32B 17/04 | (2006.01) |
| B32B 27/18 | (2006.01) |
| B32B 27/26 | (2006.01) |
| B32B 27/30 | (2006.01) |
| B32B 27/36 | (2006.01) |

(52) U.S. Cl. ............... 428/441; 428/285.1; 428/297.1; 428/297.4; 428/300.7; 428/301.1; 428/301.4; 428/480; 428/426; 428/430; 525/88; 525/94; 525/95; 525/98; 525/99; 525/165; 525/176; 525/177; 106/15.05; 106/18.11; 106/18.24; 106/18.35

(58) Field of Classification Search ........................ None
See application file for complete search history.

(56) References Cited

U.S. PATENT DOCUMENTS

| | | | |
|---|---|---|---|
| 3,925,272 A | 12/1975 | Ibata et al. | |
| 4,058,658 A * | 11/1977 | Morgan et al. | ............... 526/261 |
| 4,160,758 A | 7/1979 | Gardner | |
| 4,160,759 A * | 7/1979 | Gardner et al. | ............... 523/514 |
| 4,195,014 A | 3/1980 | Dorfman et al. | |
| 4,298,514 A | 11/1981 | Jee, Jr. | |
| 4,336,344 A | 6/1982 | Craigie | |
| 4,391,937 A * | 7/1983 | Falender et al. | ............. 524/119 |
| 4,396,745 A | 8/1983 | Ikeguchi | |
| 4,403,007 A * | 9/1983 | Coughlin | .................... 428/95 |
| 4,444,921 A | 4/1984 | South, Jr. | |
| 4,455,350 A | 6/1984 | Berbeco | |
| 4,465,808 A | 8/1984 | Dix | |
| 4,503,204 A * | 3/1985 | Bingham et al. | ............. 526/187 |
| 4,670,485 A * | 6/1987 | Hesse et al. | ................. 523/436 |
| 4,877,832 A | 10/1989 | Cassola et al. | |
| 5,008,477 A * | 4/1991 | Hussain | ...................... 570/208 |
| 5,030,778 A * | 7/1991 | Ransford | ..................... 570/208 |
| 5,093,449 A * | 3/1992 | Durney Cronin et al. | ..... 526/318 |
| 5,122,420 A * | 6/1992 | Baron et al. | ............. 428/474.4 |
| 5,204,436 A * | 4/1993 | Kishita et al. | ................. 528/15 |
| 5,206,293 A * | 4/1993 | Sakai et al. | .................. 525/194 |
| 5,221,575 A * | 6/1993 | Nakano et al. | .............. 428/323 |
| 5,302,768 A * | 4/1994 | Hussain | ...................... 570/185 |
| 5,356,991 A | 10/1994 | Chiolle et al. | |
| 5,432,226 A * | 7/1995 | Aonuma et al. | ............. 524/506 |
| 5,571,609 A * | 11/1996 | St. Lawrence et al. | ...... 442/234 |
| 5,593,619 A * | 1/1997 | Bottelberghe et al. | ....... 252/609 |
| 5,627,222 A | 5/1997 | Recker et al. | |
| 5,712,336 A | 1/1998 | Gareiss et al. | |
| 5,922,476 A * | 7/1999 | Arita et al. | .................... 428/515 |
| 5,972,811 A * | 10/1999 | St. Lawrence et al. | ...... 442/237 |
| 6,127,488 A | 10/2000 | Obrecht et al. | |
| 6,165,309 A * | 12/2000 | Burnell et al. | ............ 156/308.2 |
| 6,194,508 B1 * | 2/2001 | Achenbach et al. | ......... 524/492 |
| 6,239,245 B1 | 5/2001 | Morita et al. | |
| 6,245,419 B1 * | 6/2001 | Hakotani et al. | ............. 428/221 |
| 6,306,963 B1 * | 10/2001 | Lane et al. | ..................... 525/68 |
| 6,333,384 B1 * | 12/2001 | Lane et al. | ................... 525/124 |
| 6,448,336 B1 * | 9/2002 | Toyoshima et al. | ......... 525/191 |
| 6,521,326 B1 | 2/2003 | Fischer et al. | |
| 6,566,448 B2 | 5/2003 | Lane et al. | |
| 6,620,866 B1 | 9/2003 | Obrecht et al. | |
| 6,649,724 B2 | 11/2003 | Nakamura et al. | |

(Continued)

FOREIGN PATENT DOCUMENTS

EP    0 627 463    12/1994

(Continued)

OTHER PUBLICATIONS

Database WPI—Section Ch. Week 198744—Derwent Publication Ltd.—XP-002352163—Sep. 28, 1987.

(Continued)

Primary Examiner—Vivian Chen
(74) Attorney, Agent, or Firm—McDonnell Boehnen Hulbert & Berghoff LLP

(57) ABSTRACT

This invention concerns a thermosetting resin system that is useful in the manufacture of high performance prepreg, laminate and composite materials as well as the prepregs, laminates and composites made from the thermosetting resin composition.

18 Claims, No Drawings

U.S. PATENT DOCUMENTS

| | | | |
|---|---|---|---|
| 7,090,924 B2* | 8/2006 | Sharma et al. | 428/458 |
| 2003/0158337 A1* | 8/2003 | Choate et al. | 525/107 |
| 2004/0146728 A1* | 7/2004 | Choate et al. | 428/482 |
| 2005/0250916 A1* | 11/2005 | Choate et al. | 525/530 |

FOREIGN PATENT DOCUMENTS

| | | |
|---|---|---|
| EP | 0 736 571 | 10/1996 |
| GB | 1 062 598 | 3/1967 |
| GB | 2 068 385 | 8/1981 |
| JP | 55-045754 * | 3/1980 |
| WO | WO 01/00409 | 1/2001 |

OTHER PUBLICATIONS

Database WPI—Section Ch. Week 199517—Derwent Publication Ltd.—XP-002352164—Feb. 28, 1995.
Supplemental European Search Report for Corresponding EP Appln. No. 02804510.2 2102—PCT/US02/38853.

* cited by examiner

THERMOSETTING RESIN COMPOSITION FOR HIGH PERFORMANCE LAMINATES

CROSS REFERENCE TO RELATED APPLICATIONS

This application is a continuation of U.S. patent application Ser. No. 10/309,720, filed Dec. 4, 2002, now U.S. Pat. No. 7,090,924 which claims priority from U.S. Provisional Application Ser. No. 60/337,362, filed Dec. 5, 2001, which is incorporated herein by reference in its entirety.

BACKGROUND OF THE INVENTION (1) Field of the Invention

This invention concerns a thermosetting resin system that is useful in the manufacture of high performance prepreg, laminate and composite materials as well as the prepregs, laminates and composites made from the thermosetting resin composition.

(2) Description of the Related Art

Plastics have certain mechanical and structural limitations that have been lesssened by reinforcing the plastics with other components. Composites formed of various fibers embedded in a polymer resin matrix are especially useful, however, such compositions are susceptible to enormous physical property variations depending upon, for example, the nature of the fiber used, how the fiber is utilized, and the fiber matrix or binder. The uses for such composites range from airframes to tennis rackets and from boat hulls to rocket motor casings, and laminates for use, for example, as multilayer printed circuit boards in the electronics industry.

Performance requirements for composites and laminate materials are becoming more stringent. In the electronics industry, for example, high speed high frequency circuits require substrates with difficult to attain electrical properties, such as low dielectric loss and low dielectric constant. Current composite materials do not meet these electrical requirements. In addition, other materials that may exhibit favorable electrical properties do not possess the thermal properties required for composites and laminates. There exists a continuing need, therefore, for new composite materials having favorable thermal and electrical properties, such as low dielectric loss and low dielectric constant.

SUMMARY OF THE INVENTION

The invention provides a thermosetting resin composition useful in the manufacture of high performance composite and laminate materials. The thermosetting resin composition comprises: at least one elastomer; at least one ester; and at least one flame retardant.

The invention also provides prepregs, laminates and composites manufactured from the disclosed thermosetting resin compositions.

DESCRIPTION OF THE CURRENT EMBODIMENT

The invention provides thermosetting resin compositions useful in the manufacture of high performance composite materials, and to prepregs, laminates and composites manufactured therefrom. The compositions are particularly useful in the preparation of laminates having low dielectric constants and low dielectric loss ("low loss"). These electrical properties help solve signal speed and signal integrity problems encountered with high speed analog digital applications manufactured on laminates used with prior art resin systems. Laminate materials manufactured with the thermosetting resin compositions of the present invention can have low and flat dielectric loss ($\leq 0.005$) and low dielectric constant ($\leq 3.4$) at high frequency range of 5 GHz to 10 GHz, at comparatively low cost. "Flat dielectric loss" means that the dielectric loss is essentially constant over a range of frequencies. The compositions of this invention may have a dielectric loss as low as $\leq$ about 0.005 over a frequency range of from 2 to 10 GHz. In addition to having favorable electrical properties, prepregs prepared from the compositions of the invention are also non-tacky and easy to process.

The thermosetting resin composition includes the following ingredients: at least one elastomer; at least one ester; and at least one flame retardant.

The elastomer used in the resin composition provides the desired basic mechanical and thermal properties of the cured resin and laminates made therefrom. Suitable elastomers are any elastomers that are known to one of skill in the art to be useable in electronic composites and laminates. Preferably, the elastomer has a molecular weight in the range of about 2000 to about 20000. The elastomer can be used alone or in combination with other elastomer(s). Examples of useful elastomers include, but are not limited to, butadiene polymers, styrene butadiene polymers, acrylonitrile-butadiene copolymers, isoprene polymers, urethane elastomers, polyamides, and thermoplastic polymers in general, or mixtures thereof. One useful class of elastomers are styrene butadiene divinyl benzene compounds (SBDVB). SBDVD compounds include many unsaturated groups which allow them to crosslink with other resin compounds during resin curing. An example of an SBDVB compound is Ricon® 250, a polybutadiene styrene divinylbenzene graft terpolymer available from Sartomer (502 Thomas Jones Way, Exton, Pa. 19341). Another useful elastomer is a maleinized polybutadiene styrene copolymer. An example of a maleinized polybutadiene styrene copolymer is Ricon® 184MA6, available from Sartomer. Elastomers are present in the thermosetting resin compositions of the invention in an amount from about 20% to about 60%, preferably from about 25 to about 35%, based on 100% by weight resin solids of the composition.

The esters used in the resin compositions of the invention improve thermal and electrical properties of the resulting cured polymer and products made therefrom by reacting with unreacted elastomer ingredients and by-products. The esters react with and consume excess styrene in the preferred elastomers. The esters can be monomers, oligomers or polymers, such as polyesters. Preferably, the ester is an unsaturated ester. Also preferably the ester is styrenic based. A preferred ester is an acrylic ester such as, but not limited to, dipentaerythritol pentaacrylate. Another preferred ester is an unsaturated polyester. A preferred unsaturated polyester is the condensation reaction product of an unsaturated acid or anhydride, such as maleic anhydride or fumaric acid, or an aromatic acid, with a linear diol(s). The product of this condensation reaction preferably has the following properties: about 0% free styrene content; average molecular weight of 4000-7000; and an acid value of 12-18. Esters may be present in the thermosetting resin compositions of the invention in an amount of from about 1% to about 15%, preferably from about 2 to about 8%, more preferably from about 2% to about 6%, based on 100% by weight resin solids of the composition.

The thermosetting resin compositions of this invention also include one or more flame retardants. Any flame retardant that is known to be useful in resin compositions used to manufacture composites and laminates may be used. Examples of useable flame retardants include, but are not limited to, halides of glycidyl etherified bifinctional alcohols, halides of novolac resins such as bisphenol A, bisphenol F, polyvinylphenol or phenol, creosol, alkylphenol, catecohl, and novolac resins such as bisphenol F, inorganic flame retardants such as antimony trioxide, red phosphorus, zirconium hydroxide, barium metaborate, aluminum hydroxide, and magnesium hydroxide, and phosphor flame retardants such as tetraphenyl phosphine, tricresyl-diphenyl phosphate, triethylphosphate, cresyldiphenylphosphate, xylenyl-diphenyl phosphate, acid phosphate esters, phosphate compounds containing nitrogen, and phosphate esters containing halides. Flame retardants are present in the thermosetting resin compositions of the invention in an amount of from about 5 to about 50%, preferably from about 10 to about 40%, based on 100% by weight resin solids of the composition.

One preferred flame retardant is decabromodiphenylethane, which has the following structure:

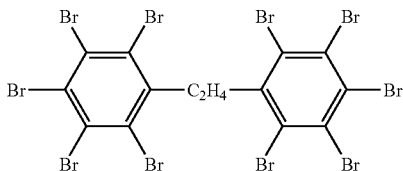

Decabromodiphenylethane is commercially available, for example, from Albemarle Corporation (451 Florida St., Baton Rouge, La. 70801). The Albemarle product is sold as Saytex™ 8010. Decabromodiphenylethane has been unexpectedly found to be easily dispersed in the resin composition. Decabromodiphenylethane also has the unexpected and synergistic result of significantly improving dielectric properties of the cured resin. As a result, the flame retardant is preferably included in the resin composition of this invention in amounts far greater than is necessary for a flame retardant in order to also enhance the dielectric properties of the cured resin. When decabromodiphenylethane is used as the flame retardant, it is preferably present in the thermosetting resin compositions of the invention in an amount of from about 10% to about 50%, more preferably from about 20% to about 45%, based on 100% by weight resin solids of the composition.

One or more catalysts are optionally added to the thermosetting resin compositions of this invention in order to enhance the rate of resin cure. The catalysts chosen may be any catalysts that are know to speed up the rate of thermosetting resin cure. Preferred catalysts include peroxide catalysts that generate free radicals such as dicumyl peroxide, or tert-butyl peroxybenzoate (commercially available from, for example, Akzo-Nobel Polymer Chemicals LLC, Chicago, Ill. as Triganox-C). A more preferred catalyst is dicumyl peroxide. Catalysts are present in the thermosetting resin compositions of the invention preferably in an amount of from about 2% to about 8%, more preferably from about 3% to about 5%, based on 100% by weight resin solids of the composition.

One or more fillers can optionally be added to the thermosetting resin compositions of this invention to improve chemical and electrical properties of the cured resin. Examples of properties that can be modified with fillers include, but are not limited to, coefficient of thermal expansion, lowering CTE, increasing modulus, and reducing prepreg tack. Non-limiting examples of useful fillers include particulate forms of Teflon®, talc, quartz, ceramics, particulate metal oxides such as silica, titanium dioxide, alumina, ceria, clay, boron nitride, wollastonite, and mixtures thereof. Preferred fillers include calcined clay or fused silica. Another preferred filler is fused silica. Yet another preferred filler is silane treated silica. More preferably, the silane treated filler filler is fused silica treated with epoxy silane. When used, fillers may be present in the thermosetting resin compositions of the invention in an amount of from about 0% to about 40%, preferably from about 5 to about 40%, based on 100% by weight resin solids of the composition. Preferably the particle size of the filler is about 20 µm to about 80 µm.

One or more solvents are optionally incorporated into the thermosetting resins of this invention in order to control resin viscosity and in order to maintain the resin ingredients in a suspended dispersion. Any solvent known by one of skill in the art to be useful in conjunction with thermosetting resin systems can be used. Particularly useful solvents include methylethylketone (MEK), toluene, and mixtures thereof. The choice of solvent is often dictated by the resin curing method. When the resin is cured with hot air, then ketones are typically the preferred solvent. When the resins are IR cured, then a mixture of ketones and toluene is typically preferred. When used, solvents are present in the thermosetting resin compositions of the invention in an amount of from about 20% to about 50% as a weight percentage of the total weight of the composition.

The compositions of the invention can optionally include cyanate esters, which can improve thermal performance and provide good electrical properties. Cyanate esters can participate in the polymerization and incorporate into the resin backbone. Various cyanate esters can be used, including, but not limited to 2,2-Bis(4-cyanatophenyl) isopropylidene (available from Lonza Group under the name Primaset® BADCy), bisphenol A cyanate ester (available from Ciba Geigy under the name AroCy™ B10), and mixtures thereof. When used, the cyanate ester(s) are present in the thermosetting resin compositions in an amount about 2% to about 15%, preferably from about 4 to about 8%, based on 100% by weight resin solids of the composition.

One useful composition of this invention has the following formulation, wherein amounts are based on 100% by weight resin solids of the composition:

from about 25 to about 35 wt % of at least one elastomer;

from about 2 to about 8 wt % of at least one ester;

from about 20 to about 45 wt % of at least one flame retardant;

from about 5 to about 40 wt % of at least one filler; and from about 3 to about 5 wt % of at least one catalyst.

The ingredients are suspended in a solvent in a ratio ranging from about 50-80 wt % solids to 50-20 wt % solvent and preferably about 70 wt % solids to about 30 wt % solvent.

Other useful compositions of this invention have the following formulations:

| HIGH PERFORMANCE ELECTRICAL LAMINATE FORMULATION | | |
|---|---|---|
| Ingredients | Range (wt %) | Preferred Amounts(wt %) |
| Styrene-Butadiene-Divinylbenzene terpolymer from Sartomer (Elastomer) | 20-60 | 25-30 |
| An unsaturated Polyester | 2-15 | 5-7 |
| Decabromodiphenylethane | 10-50 | 30-40 |

-continued

HIGH PERFORMANCE ELECTRICAL LAMINATE FORMULATION

| Ingredients | Range (wt %) | Preferred Amounts(wt %) |
|---|---|---|
| Calcined Clay or Fused Silica (filler) | 20-40 | 23-28 |
| Dicumyl peroxide (catalyst) | 2-5 | 4 |

The preferred ingredients are suspended in a solvent such as toluene, MEK or toluene/MEK in a ratio ranging from about 50-80 wt % solids to 50-20 wt % solvent and preferably about 70 wt % solids to about 30 wt % solvent.

Yet other useful composition of this invention has the following formulation, based on 100% by weight resin solids of the composition.:
  from about 30 to about 35 wt % of RICON® 250 resin;
  from about 2 to about 4 wt % of an unsaturated polyester;
  from about 20 to about 25 wt % of decabromodiphenylethane;
  from about 32 to about 38 wt % of fused silica; and
  from about 5 to about 6 wt % of dicumyl peroxide.

The thermosetting resin compositions of this invention are useful for making prepregs in a continuous process. Prepregs are generally manufactured using a core material such as a roll of woven glass web which is unwound into a series of drive rolls. The web then passes into a coating area where the web is passed through a tank which contains a thermosetting resin system of this invention, solvents and other components. The glass web becomes saturated with the resin in the coating area. The resin saturated glass web is then passed through a pair of metering rolls which remove excess resin from the resin saturated glass web and thereafter, the resin coated web travels the length of a drying tower for a selected period of time until the solvent is at least partially evaporated from the web. Second and subsequent coatings of resin can be applied to the web by repeating these steps until the preparation of the prepreg is complete whereupon the prepreg is wound onto roll.

Lamination process typically entail a stack-up of one or more prepreg layers between one or two sheets of conductive foil (such as copper foil). Lamination methods and parameters may vary widely, and are generally well known to the person of ordinary skill in the art. In one example of a cure cycle, the stack is maintained at a pressure of about 40 psi to about 900 psi and under a vacuum of about 30 in/Hg. The stack temperature is raised from about 180° F. to about 375° F. over a period of about 20 minutes. The stack remains at a temperature of about 375° F. for 75 minutes after which the stack is cooled from a temperature of 375° F. to a temperature to 75° F. over a 20 minute period.

In another process for manufacturing laminates, thermosetting resins of this invention are premixed in a mixing vessel under ambient temperature and pressure. The viscosity of the pre-mix is ~600-1000 cps and can be adjusted by adding or removing solvent from the resin. A fabric substrate, such as E glass, is pulled through a dip tank including the premixed resin, through an oven tower where excess solvent is driven off and the prepreg is rolled or sheeted to size, layed up between Cu foil in various constructions depending on glass weave style, resin content & thickness requirements.

A thermosetting resin composition of the invention can also be coated directly on Cu substrate to form resin coated Cu using slot-die or other related coating techniques.

The following examples are illustrative of various aspects of the invention but do not serve to limit its scope.

EXAMPLES

Example 1

Electrical and Thermal Properties

In this example, the electrical and thermal properties of a prepreg made with a composition of the invention were measured. The ingredients of the composition and their amounts are listed in Table 1. Toluene was used as solvent to provide a total solids content of about 69%.

TABLE 1

| Material | Amount (percentage of 100% solids) |
|---|---|
| Ricon ® 250 resin | 31.91% |
| an unsaturated polyester | 2.90% |
| Saytex 8010 flame retardant | 23.21% |
| Fused silica filler | 36.22% |
| Dicumyl peroxide catalyst | 5.76% |

The prepreg was prepared as described above. A 0.03" woven glass fabric was used as the core material. The glass transition temperature (Tg) of the material was 100° C. Some thermal properties of the prepreg are provided in Table 2. Some electrical properties of the prepreg are provided in Table 3. The data show that the resin composition provides good thermal properties and maximum Dk and Df values of 3.4 and 0.0043, respectively, at high frequency ranges of 2 GHz to 10 GHz.

TABLE 2

Thermal Properties

| Property | Measurement |
|---|---|
| CTE[a] 0 to 100° C. | 25-30 ppm/m/° C. |
| CTE 20 to 160° C. | 60-100 ppm/m/° C. |
| CTE RT to 288° C. | approx 180 ppm/m/° C. |
| T-260[b] | >60 minutes |
| T-288[c] | Approx 30-60 minutes |

[a]coefficient of thermal expansion;
[b]time to delamination at 260° C.;
[c]time to delamination at 288° C.

TABLE 3

Electrical properties.

| Property | Measurement |
|---|---|
| | Permittivity $(DK)_{max}$ |
| 2 GHz (Bereskin method) | 3.3 |
| 5 GHz (Bereskin Method) | 3.3 |
| 10 GHz (Bereskin Method) | 3.4 |
| | Loss Tangent $(DF)_{max}$ |
| 2 GHz (Bereskin method) | 0.004 |
| 5 GHz (Bereskin Method) | 0.0042 |
| 10 GHz (Bereskin Method) | 0.0043 |

It is contemplated that various modifications may be made to the compositions, prepregs, laminates and composites of the present invention without departing from the spirit and scope of the invention as defined in the following claims.

We claim:

1. A thermosetting resin composition comprising:
   at least one elastomer selected from the group consisting of a styrene-butadiene-divinylbenzene terpolymer, a maleinized polybutadiene styrene copolymer, and mixtures thereof;
   from about 2 to about 8 wt % of at least one ester; and
   at least one flame retardant,
   wherein the at least one ester includes about 0% free styrene.

2. The composition of claim 1 wherein the at least one elastomer comprises from about 20 wt % to about 60 wt %; and the at least one flame retardant comprises from about 5 wt % to about 50 wt %, each as a percentage of the composition solids content.

3. The composition of claim 1 wherein the at least one ester is an unsaturated ester.

4. The composition of claim 3 wherein the unsaturated ester is an unsaturated polyester.

5. The composition of claim 1 further comprising at least one catalyst.

6. The composition of claim 5 wherein the at least one catalyst is a peroxide catalyst.

7. The composition of claim 6 wherein the at least one catalyst is selected from dicumyl peroxide, tert-butyl peroxbenzoate, and mixtures thereof.

8. The composition of claim 5 wherein the at least one catalyst comprises about 2 wt % to about 8 wt % as a percentage of the composition solids content.

9. The composition of claim 1 wherein the at least one flame retardant is decabromodiphenylethane.

10. The composition of claim 1 further comprising at least one filler selected from the group consisting of teflon, talc, quartz, ceramics, particulate metal oxides, silica, titanium dioxide, alumina, ceria, clay, boron nitride, wollastonite, and mixtures thereof.

11. The composition of claim 10 wherein the filler comprises about 5% to about 40% as a percentage of the composition solids content.

12. The composition of claim 10 wherein the filler is silane treated fused silica.

13. A prepreg comprising the thermosetting resin composition of claim 1 and a core material.

14. The prepreg of claim 13 wherein the core material comprises a woven glass web.

15. A prepreg comprising a sheet of partially cured thermosetting resin of claim 1.

16. The prepreg of claim 15 wherein the coefficient of thermal expansion 0-100° C. is from 25-30 ppm/m/° C.

17. A thermosetting resin composition comprising:
    a polybutadiene styrene divinylbenzene terpolymer;
    from about 2 wt % to about 4 wt % of an unsaturated polyester;
    decabromodiphenylethane;
    fused silica; and
    dicumyl peroxide, wherein the unsaturated polyester includes about 0% free styrene.

18. The composition of claim 17 wherein the terpolymer comprises from about 30 wt % to about 35 wt %; the decabromodiphenylethane comprises from about 20 wt % to about 25 wt %; the fused silica comprises from about 32 wt % to about 38 wt %; and the dicumyl peroxide comprises from about 5 wt % to about 6 wt %, each as a percentage of the composition solids content.

* * * * *